(12) United States Patent
Akasu et al.

(10) Patent No.: US 12,543,538 B2
(45) Date of Patent: Feb. 3, 2026

(54) TEMPORARY FIXATION LAYERED FILM AND PRODUCTION METHOD THEREFOR, TEMPORARY FIXATION LAYERED BODY, AND SEMICONDUCTOR DEVICE PRODUCTION METHOD

(71) Applicant: Resonac Corporation, Tokyo (JP)

(72) Inventors: Yuta Akasu, Tokyo (JP); Emi Miyazawa, Tokyo (JP); Takashi Kawamori, Tokyo (JP); Yasuyuki Oyama, Tokyo (JP); Tetsuya Enomoto, Tokyo (JP)

( * ) Notice: Subject to any disclaimer, the term of this patent is extended or adjusted under 35 U.S.C. 154(b) by 548 days.

(21) Appl. No.: 17/999,848

(22) PCT Filed: May 21, 2021

(86) PCT No.: PCT/JP2021/019464
§ 371 (c)(1),
(2) Date: Nov. 24, 2022

(87) PCT Pub. No.: WO2021/241459
PCT Pub. Date: Dec. 2, 2021

(65) Prior Publication Data
US 2023/0207374 A1    Jun. 29, 2023

(30) Foreign Application Priority Data

May 26, 2020  (JP) .................................. 2020-091215

(51) Int. Cl.
*H01L 21/683*  (2006.01)
*B32B 15/085*  (2006.01)
(Continued)

(52) U.S. Cl.
CPC ........ *H01L 21/6836* (2013.01); *B32B 15/085* (2013.01); *B32B 15/092* (2013.01);
(Continued)

(58) Field of Classification Search
CPC .................................................. H01L 21/6836
See application file for complete search history.

(56) References Cited

U.S. PATENT DOCUMENTS

2013/0240141 A1*  9/2013  Soejima ................. H01L 24/19
156/306.3

FOREIGN PATENT DOCUMENTS

JP        2012-052038         3/2012
JP        2012052038 A    *   3/2012    ........... C08G 18/757
(Continued)

OTHER PUBLICATIONS

International Preliminary Report on Patentability with Written Opinion dated Dec. 8, 2022 for PCT/JP2021/019464.
(Continued)

*Primary Examiner* — Christine S. Kim
*Assistant Examiner* — Cole Leon Lindsey
(74) *Attorney, Agent, or Firm* — SHIPWAY IP (57) ABSTRACT

A method for producing a laminated film for temporary fixation of a semiconductor member to a support member includes providing a first curable resin layer on one surface of a metal foil and providing a second curable resin layer on the other surface of the metal foil to obtain the laminated film. A laminated film used for temporarily fixing a semiconductor member to a support member includes a first curable resin layer, a metal foil, and a second curable resin layer laminated in sequence.

15 Claims, 5 Drawing Sheets

(51) Int. Cl.
  *B32B 15/092* (2006.01)
  *B32B 38/00* (2006.01)
  *C09J 7/28* (2018.01)
  *C09J 125/08* (2006.01)
  *C09J 163/00* (2006.01)
  *H01L 21/56* (2006.01)

(52) U.S. Cl.
  CPC .............. *C09J 7/28* (2018.01); *C09J 125/08* (2013.01); *C09J 163/00* (2013.01); *H01L 21/561* (2013.01); *H01L 21/568* (2013.01); *B32B 2038/0076* (2013.01); *B32B 2250/03* (2013.01); *B32B 2310/0825* (2013.01); *B32B 2405/00* (2013.01); *B32B 2457/14* (2013.01); *C09J 2203/326* (2013.01); *C09J 2301/124* (2020.08); *C09J 2301/414* (2020.08); *C09J 2301/416* (2020.08); *C09J 2301/502* (2020.08); *H01L 2221/68327* (2013.01); *H01L 2221/68386* (2013.01)

(56) References Cited

FOREIGN PATENT DOCUMENTS

| | | |
|---|---|---|
| JP | 2012-126803 | 7/2012 |
| JP | 2013-033814 | 2/2013 |
| JP | 2016-138182 | 8/2016 |
| JP | 2018074115 A * | 5/2018 |
| TW | 201711846 | 4/2017 |
| WO | 2019/107508 | 6/2019 |

OTHER PUBLICATIONS

International Search Report dated Aug. 24, 2021 for PCT/JP2021/019464.

* cited by examiner

Fig.5B

TEMPORARY FIXATION LAYERED FILM AND PRODUCTION METHOD THEREFOR, TEMPORARY FIXATION LAYERED BODY, AND SEMICONDUCTOR DEVICE PRODUCTION METHOD

CROSS-REFERENCE TO RELATED APPLICATIONS

This application is a 35 U.S.C. § 371 national phase application of PCT/JP2021/019464, filed on May 21, 2021, which claims priority to Japanese Patent Application No. 2020-091215, filed on May 26, 2020.

TECHNICAL FIELD

The present disclosure relates to a laminated film for temporary fixing, a method for producing the laminated film, a laminated body for temporary fixing, and a method for producing a semiconductor device.

BACKGROUND ART

In the field of semiconductor devices, in recent years, technologies related to packages called SIP (System in Package), in which a plurality of semiconductor elements are laminated, have remarkably grown. In a SIP-type package, since a large number of semiconductor elements are laminated, thinning is required for the semiconductor elements. In response to this requirement, in a semiconductor element, an integrated circuit is incorporated into a semiconductor member (for example, a semiconductor wafer), and then the semiconductor member is subjected to processing treatments such as, for example, thinning by grinding the back surface of the semiconductor member, and singularization of dicing the semiconductor wafer. These processing treatments for a semiconductor member are usually carried out by temporarily fixing the semiconductor member to a support member by means of a temporary fixing material layer (see, for example, Patent Literatures 1 to 3).

The semiconductor member that has been subjected to processing treatments is strongly fixed to the support member, with the temporary fixing material layer interposed therebetween. Therefore, in a method for producing a semiconductor device, it is required that the semiconductor member after the processing treatments can be separated from the support member while preventing damage to the semiconductor member or the like. In Patent Literature 1, as a method for separating such a semiconductor member, a method of physically separating the semiconductor member while heating the temporary fixing material layer is disclosed. Furthermore, in Patent Literatures 2 and 3, methods of separating the semiconductor member by irradiating the temporary fixing material layer with laser light (coherent light) are disclosed.

CITATION LIST

Patent Literature

Patent Literature 1: JP 2012-126803A
Patent Literature 2: JP 2016-138182 A
Patent Literature 3: JP 2013-033814 A

SUMMARY OF INVENTION

Technical Problem

However, in the method disclosed in Patent Literature 1, there is a problem that damage caused by thermal history and the like occur in the semiconductor wafer, and the product yield is lowered. On the other hand, in the methods disclosed in Patent Literatures 2 and 3, there are problems such as: (i) the area of irradiation with a laser beam is narrow, and it is necessary to irradiate the entire semiconductor member repeatedly for several times, (ii) since it is necessary to control the focus of the laser beam and perform scan irradiation, the process becomes complicated, and (iii) highly expensive apparatuses are required.

It is a main object of the present disclosure to provide a laminated film for temporary fixing capable of forming a temporary fixing material layer that has excellent separability from a temporarily fixed semiconductor member and a support member, and a method for producing the laminated film.

Solution to Problem

The inventors of the present invention conducted a thorough investigation, and the inventors found that when a laminated film including a metal foil and two curable resin layers having the metal foil interposed therebetween is used as a temporary fixing material layer, a temporarily fixed semiconductor member and a support member can be separated by lower light irradiation energy, thus completing the invention of the present disclosure.

An aspect of the present disclosure relates to a method for producing a laminated film for temporarily fixing a semiconductor member to a support member. This method for producing a laminated film for temporary fixing includes providing a first curable resin layer on one surface of a metal foil and providing a second curable resin layer on the other surface of the metal foil to obtain a laminated film for temporary fixing. According to a laminated film for temporary fixing obtainable by such a method for producing, it is possible to form a temporary fixing material layer having excellent separability between a temporarily fixed semiconductor member and a support member. The reason why a temporary fixing material layer formed from a laminated film for temporary fixing provides such an effect is not necessarily clearly understood; however, the present inventors infer that it is because diffusion of the heat generated at the metal foil in the temporary fixing material layer by light irradiation to the support member can be suppressed, and temperature increase of the temporary fixing material layer can be promoted by lower light irradiation energy.

From the viewpoints of high coefficient of expansion, high thermal conduction, and the like, the metal foil may contain at least one metal selected from the group consisting of silver, gold, platinum, copper, titanium, nickel, molybdenum, chromium, and aluminum.

Another aspect of the present disclosure relates to a laminated film for temporarily fixing a semiconductor member to a support member. This laminated film for temporary fixing includes a first curable resin layer, a metal foil, and a second curable resin layer laminated in sequence. The metal constituting the metal foil may be, for example, at least one selected from the group consisting of silver, gold, platinum, copper, titanium, nickel, molybdenum, chromium, and aluminum.

According to another aspect of the present disclosure relates to a laminated body for temporary fixing. This laminated body for temporary fixing includes a support member and a temporary fixing material layer provided on the support member. The temporary fixing material layer includes a first curable resin layer, a metal foil, and a second curable resin layer laminated in sequence on the support member. According to such a laminated body for temporary fixing, since the laminated body is provided with a temporary fixing material layer that includes a first curable resin layer, a metal foil, and a second curable resin layer laminated in sequence, it is possible to separate a temporarily fixed semiconductor member from the support member with lower light irradiation energy. This is inferred to be because, as described above, diffusion of the heat generated at the metal foil in the temporary fixing material layer by light irradiation to the support member can be suppressed, and temperature increase of the temporary fixing material layer can be promoted with lower light irradiation energy.

Another aspect of the present disclosure relates to a method for producing a semiconductor device. This method for producing a semiconductor device includes preparing the above-described laminated body for temporary fixing; temporarily fixing a semiconductor member to a support member, with a temporary fixing material layer interposed therebetween; processing the semiconductor member temporarily fixed to the support member; and irradiating the laminated body for temporary fixing with light through the support member side and then separating the semiconductor member from the support member. According to such a method for producing a semiconductor device, since the above-described laminated body for temporary fixing is used, it is possible to separate a temporarily fixed semiconductor member from a support member with lower light irradiation energy.

The light may be incoherent light. The incoherent light may be light containing at least infrared light.

The light source of the light may be a xenon lamp.

Advantageous Effects of Invention

According to the present disclosure, a laminated film for temporary fixing capable of forming a temporary fixing material layer having excellent separability between a temporarily fixed semiconductor member and a support member, and a method for producing the laminated film are provided. Furthermore, according to the present disclosure, a laminated body for temporary fixing including such a temporary fixing material layer, and a method for producing a semiconductor device that uses the laminated body for temporary fixing are provided.

DESCRIPTION OF EMBODIMENTS

Hereinafter, embodiments of the present disclosure will be described with appropriate reference to the drawings. However, the present disclosure is not intended to be limited to the following embodiments. In the following embodiments, the constituent elements thereof (also containing steps and the like) are not essential, unless particularly stated otherwise. The sizes of the constituent elements in each diagram are conceptual, and the relative relationships in size between the constituent elements are not limited to those shown in each diagram.

The same also applies to the numerical values and ranges thereof in the present specification, and the present disclosure is not limited thereby. A numerical value range indicated by using the term "to" in the present specification represents a range containing the numerical values described before and after the term "to" as the minimum value and the maximum value, respectively. With regard to the numerical value ranges described stepwise in the present specification, the upper limit value or the lower limit value described in one numerical value range may be replaced with the upper limit value or the lower limit value of another numerical value range described stepwise. Furthermore, with regard to a numerical value range described in the present specification, the upper limit value or the lower limit value of the numerical value range may be replaced with a value shown in the Examples.

According to the present specification, (meth)acrylic acid means acrylic acid or methacrylic acid corresponding thereto. The same also applies to other similar expressions such as (meth)acrylate and (meth)acryloyl group.

[Laminated Film for Temporary Fixing]

Figure 1:
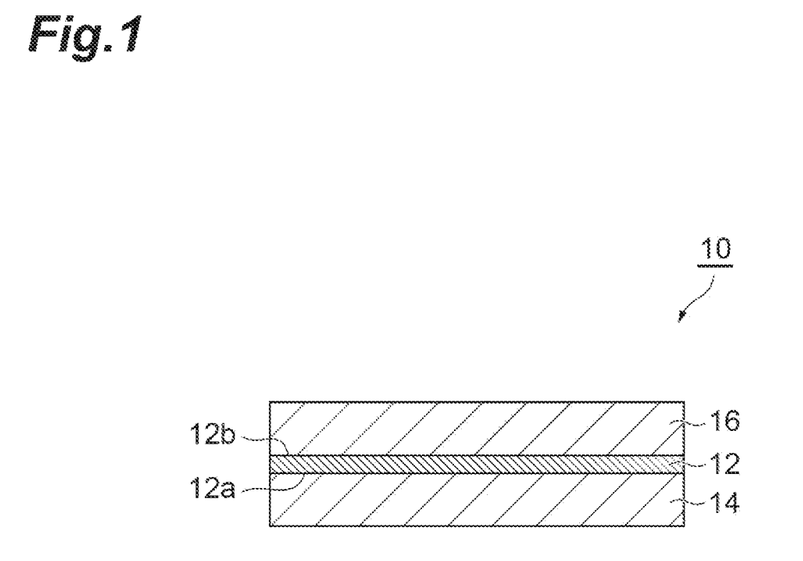
FIG. 1 is a schematic cross-sectional view illustrating an embodiment of a laminated film for temporary fixing.

FIG. 1 is a schematic cross-sectional view illustrating an embodiment of a laminated film for temporary fixing. The laminated film for temporary fixing 10 shown in FIG. 1 is used for temporarily fixing a semiconductor member to a support member. More specifically, the laminated film for temporary fixing 10 is used in order to form a layer (temporary fixing material layer) for temporarily fixing a semiconductor member to a support member while processing the semiconductor member in the production of a semiconductor device. The laminated film for temporary fixing 10 includes a first curable resin layer 14, a metal foil 12, and a second curable resin layer 16 laminated in sequence. In other words, the laminated film for temporary fixing 10 includes a metal foil 12; a first curable resin layer 14 provided on a first surface 12a of the metal foil 12; and a second curable resin layer 16 provided on a second surface 12b of the metal foil 12, the second surface 12b being on the opposite side of the first surface 12a. According to such a laminated film for temporary fixing, it is possible to form a temporary fixing material layer having excellent separability between a temporarily fixed semiconductor member and a support member.

The metal foil 21 can be a metal foil formed from a metal that absorbs light and generates heat. The metal foil 12 may be a metal foil formed from a metal that absorbs light containing infrared light and generates heat. Examples of the metal that constitutes such a metal foil include single metals such as silver, gold, platinum, copper, titanium, nickel, molybdenum, chromium, and aluminum; and alloys such as SUS, nichrome, duralumin, bronze, cupronickel, brass, and steel. From the viewpoints of the high coefficient of expansion, high thermal conduction, and the like, the metal foil 12 may contain at least one metal selected from the group consisting of silver, gold, platinum, copper, titanium, nickel, molybdenum, chromium, and aluminum, and may be copper. The metal foil may include, for example, a glossy surface that is glossy, and a non-glossy surface that is not glossy. When a temporary fixing material layer is formed by sticking the first curable resin layer 14 of the laminated film for temporary fixing 10 to a support member, from the viewpoint that reflection of light upon light irradiation is suppressed, it is preferable that the first surface 12a of the metal foil 12 in the laminated film for temporary fixing 10 is a non-glossy surface.

The thickness of the metal foil 12 may be, for example, more than 5 μm, 6 μm or more, or 8 μm or more, from the viewpoint of handleability and the like at the time of producing the laminated film for temporary fixing. From the viewpoint of promoting temperature increase caused by suppression of heat dissipation, or the like, the thickness of the metal foil 12 may be, for example, 100 μm or less, 80 μm or less, 60 μm or less, 50 μm or less, 40 μm or less, 30 μm or less, or 20 μm or less.

The first curable resin layer 14 and the second curable resin layer 16 are layers containing a curable resin component that is cured by heat or light, and the curable resin layers may be layers formed from a curable resin component. The curable resin component can be a curable resin component that is cured by heat or light. The component that constitutes the curable resin component for the first curable resin layer 14 and the component that constitutes the curable resin component for the second curable resin layer 16 may be identical with each other or may be different from each other. From the viewpoint of production of the laminated film for temporary fixing, it is preferable that the curable resin component (each component constituting the curable resin component) for the first curable resin layer 14 and the curable resin component (each component constituting the curable resin component) for the second curable resin layer 16 are identical with each other.

The curable resin component may be, for example, a curable resin component containing a thermoplastic resin and a thermosetting resin.

The thermoplastic resin may be a resin having thermoplasticity, or a resin that has thermoplasticity at least in an uncured state and forms a crosslinked structure after being heated. Examples of the thermoplastic resin include a hydrocarbon resin, polycarbonate, polyphenylene sulfide, polyether sulfone, polyetherimide, polyimide, a petroleum resin, and a novolac resin. These may be used singly or in combination of two or more kinds thereof. Among these, the thermoplastic resin may be a hydrocarbon resin.

The hydrocarbon resin is a resin having a main skeleton composed of a hydrocarbon. Examples of such a hydrocarbon resin include an ethylene/propylene copolymer, an ethylene/1-butene copolymer, an ethylene/propylene/1-butene copolymer elastomer, an ethylene/1-hexene copolymer, an ethylene/1-octene copolymer, an ethylene/styrene copolymer, an ethylene/norbornene copolymer, a propylene/1-butene copolymer, an ethylene/propylene/non-conjugated diene copolymer, an ethylene/1-butene/non-conjugated diene copolymer, an ethylene/propylene/1-butene/non-conjugated diene copolymer, polyisoprene, polybutadiene, a styrene/butadiene/styrene block copolymer (SBS), a styrene/isoprene/styrene block copolymer (SIS), a styrene/ethylene/butylene/styrene block copolymer (SEBS), and a styrene/ethylene/propylene/styrene block copolymer (SEPS). These hydrocarbon resins may be subjected to a hydrogenation treatment. Furthermore, these hydrocarbon resins may be carboxy-modified by means of maleic anhydride or the like. Among these, the hydrocarbon resin may contain a hydrocarbon resin containing a monomer unit derived from styrene (styrene-based resin) or may contain a styrene/ethylene/butylene/styrene block copolymer (SEBS).

The Tg of the thermoplastic resin may be −100° C. to 500° C., −50° C. to 300° C., or −50° C. to 50° C. When the Tg of the thermoplastic resin is 500° C. or lower, flexibility is easily secured when a film-shaped temporary fixing material is formed, and there is a tendency that low-temperature stickability can be enhanced. When the Tg of the thermoplastic resin is −100° C. or higher, there is a tendency that deterioration of handleability and peelability caused by an excessive increase in flexibility can be suppressed when a film-shaped temporary fixing material is formed.

The Tg of a thermoplastic resin is a mid-point glass transition temperature value obtainable by differential scanning calorimetry (DSC). The Tg of a thermoplastic resin is specifically a mid-point glass transition temperature obtained by measuring the change in calorific value under the conditions of a temperature increase rate of 10° C./min and a measurement temperature of −80° C. to 80° C. and calculating the mid-point glass transition temperature by the method according to JIS K 7121.

The weight average molecular weight (Mw) of the thermoplastic resin may be 10,000 to 5,000,000 or 100,000 to 2,000,000. When the weight average molecular weight is 10,000 or more, heat resistance of the temporary fixing material layer to be formed tends to be easily secured. When the weight average molecular weight is 5,000,000 or less, a decrease in flow and a decrease in stickability tend to be easily suppressed when a film-shaped temporary fixing material layer or a resin layer is formed. Note that the weight average molecular weight is a value obtained by a gel permeation chromatography method (GPC) and calculated relative to polystyrene standards using a calibration curve based on standard polystyrenes.

The content of the thermoplastic resin may be, for example, 40 to 90 parts by mass with respect to 100 parts by mass of the total amount of the curable resin component. The content of the thermoplastic resin may be, for example, 50 parts by mass or more or 60 parts by mass or more and may be 85 parts by mass or less or 80 parts by mass or less, with respect to 100 parts by mass of the total amount of the curable resin component. When the content of the thermoplastic resin is in the above-described range, the thin film-formability and flatness of the temporary fixing material layer tend to be superior.

The thermosetting resin means a resin that is cured by heat and is a concept that does not include the above-described thermoplastic resin (hydrocarbon resin). Examples of the thermosetting resin include an epoxy resin, an acrylic resin, a silicone resin, a phenol resin, a thermosetting polyimide resin, a polyurethane resin, a melamine resin, and a urea resin. These may be used singly or in combination of two or more kinds thereof. Among these, the thermosetting resin may be an epoxy resin from the viewpoint of having superior heat resistance, workability, and reliability. The thermosetting resin may be used in combination with a thermosetting resin curing agent (in the case of using an epoxy resin as the thermosetting resin, an epoxy resin curing agent).

The epoxy resin is not particularly limited as long as it is cured and then has a heat-resistant action. Examples of the epoxy resin include bifunctional epoxy resins such as bisphenol A type epoxy; novolac type epoxy resins such as a phenol novolac type epoxy resin and a cresol novolac type epoxy resin; and alicyclic epoxy resins such as a dicyclopentadiene type epoxy resin. Furthermore, the epoxy resin may also be, for example, a polyfunctional epoxy resin, a glycidylamine type epoxy resin, or a heterocyclic-containing epoxy resin. Among these, from the viewpoints of heat resistance and weather resistance, the epoxy resin may contain an alicyclic epoxy resin.

When an epoxy resin is used as the thermosetting resin, the curable resin component may contain an epoxy resin curing agent. Regarding the epoxy resin curing agent, any known curing agent that is conventionally used can be used. Examples of the epoxy resin curing agent include an amine; a polyamide; an acid anhydride; polysulfide; boron trifluoride; a bisphenol having two or more phenolic hydroxyl groups in one molecule, such as bisphenol A type, bisphenol F type, or bisphenol S type; and a phenol resin such as a phenol novolac resin, a bisphenol A type novolac resin, a cresol novolac resin, or a phenol aralkyl resin.

The total content of the thermosetting resin and the thermosetting resin curing agent may be 10 to 60 parts by mass with respect to 100 parts by mass of the total amount of the curable resin component. The total content of the thermosetting resin and the thermosetting resin curing agent may be 15 parts by mass or more or 20 parts by mass or more and may be 50 parts by mass or less or 40 parts by mass or less, with respect to 100 parts by mass of the total amount of the curable resin component. When the total content of the thermosetting resin and the thermosetting resin curing agent is in the above-described range, the temporary fixing material layer tend to have superior thin film-formability, flatness, heat resistance, and the like.

The curable resin component may further contain a curing accelerator. Examples of the curing accelerator include an imidazole derivative, a dicyandiamide derivative, a dicarboxylic acid dihydrazide, triphenylphosphine, tetraphenylphosphonium tetraphenylborate, 2-ethyl-4-methylimidazole-tetraphenylborate, and 1,8-diazabicyclo[5,4,0]undecane-7-tetraphenylborate. These may be used singly or in combination of two or more kinds thereof.

The content of the curing accelerator may be 0.01 to 5 parts by mass with respect to 100 parts by mass of the total amount of the thermosetting resin and the thermosetting resin curing agent. When the content of the curing accelerator is in the above-described range, curability is enhanced, and heat resistance tends to be superior.

The curable resin component may further contain a polymerizable monomer and a polymerization initiator. The polymerizable monomer is not particularly limited as long as it is polymerized by heating or irradiation with ultraviolet light or the like. From the viewpoints of the selectivity and the ease of purchase of the material, the polymerizable monomer may be, for example, a compound having a polymerizable functional group such as an ethylenically unsaturated group. Examples of the polymerizable monomer include (meth)acrylate, halogenated vinylidene, vinyl ether, vinyl ester, vinylpyridine, vinyl amide, and arylated vinyl. Among these, the polymerizable monomer may be a (meth)acrylate. The (meth)acrylate may be any of a monofunctional (unifunctional), bifunctional, or trifunctional or higher-functional (meth)acrylate; however, from the viewpoint of obtaining sufficient curability, the (meth)acrylate may be a bifunctional or higher-functional (meth)acrylate.

Examples of the monofunctional (meth)acrylate include (meth)acrylic acid; aliphatic (meth)acrylates such as methyl (meth)acrylate, ethyl (meth)acrylate, butyl (meth)acrylate, isobutyl (meth)acrylate, tert-butyl (meth)acrylate, butoxyethyl (meth)acrylate, isoamyl (meth)acrylate, hexyl (meth)acrylate, 2-ethylhexyl (meth)acrylate, heptyl (meth)acrylate, octyl heptyl (meth)acrylate, nonyl (meth)acrylate, decyl (meth)acrylate, 2-hydroxyethyl (meth)acrylate, 2-hydroxypropyl (meth)acrylate, 3-chloro-2-hydroxypropyl (meth)acrylate, 2-hydroxybutyl (meth)acrylate, methoxy polyethylene glycol (meth)acrylate, ethoxy polyethylene glycol (meth)acrylate, methoxy polypropylene glycol (meth)acrylate, ethoxy polypropylene glycol (meth)acrylate, and mono (2-(meth)acryloyloxyethyl) succinate; and aromatic (meth) acrylates such as benzyl (meth)acrylate, phenyl (meth)acrylate, o-biphenyl (meth)acrylate, 1-naphthyl (meth)acrylate, 2-naphthyl (meth)acrylate, phenoxyethyl (meth)acrylate, p-cumyl phenoxyethyl (meth)acrylate, o-phenyl phenoxyethyl (meth)acrylate, 1-naphthoxyethyl (meth)acrylate, 2-naphthoxyethyl (meth)acrylate, phenoxy polyethylene glycol (meth)acrylate, nonyl phenoxy polyethylene glycol (meth)acrylate, phenoxy polypropylene glycol (meth)acrylate, 2-hydroxy-3-phenoxypropyl (meth)acrylate, 2-hydroxy-3-(o-phenylphenoxy)propyl (meth)acrylate, 2-hydroxy-3-(1-naphthoxy)propyl (meth)acrylate, 2-hydroxy-3-(2-naphthoxy)propyl (meth)acrylate.

Examples of the bifunctional (meth)acrylate include aliphatic (meth)acrylates such as ethylene glycol di(meth)acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, dipropylene glycol di(meth)acrylate, tripropylene glycol di(meth)acrylate, tetrapropylene glycol di(meth)acrylate, polypropylene glycol di(meth)acrylate, ethoxylated polypropylene glycol di(meth)acrylate, 1,3-butanediol di(meth)acrylate, 1,4-butanediol di(meth)acrylate, neopentyl glycol di(meth)acrylate, 3-methyl-1,5-pentanediol di(meth)acrylate, 1,6-hexanediol di(meth)acrylate, 2-butyl-2-ethyl-1,3-propanediol di(meth)acrylate, 1,9-nonanediol di(meth)acrylate, 1,10-decanediol di(meth)acrylate, glycerin di(meth)acrylate, tricyclodecane dimethanol (meth)acrylate, and ethoxylated 2-methyl-1,3-propanediol di(meth)acrylate; and aromatic (meth)acrylates such as ethoxylated bisphenol A type di(meth)acrylate, propoxylated bisphenol A type di(meth)acrylate, ethoxylated propoxylated bisphenol A type di(meth)acrylate, ethoxylated bisphenol F type di(meth)acrylate, propoxylated bisphenol F type di(meth)acrylate, ethoxylated propoxylated bisphenol F type di(meth)acrylate, ethoxylated fluorene type di(meth)acrylate, propoxylated fluorene type di(meth)acrylate, and ethoxylated propoxylated fluorene type di(meth)acrylate.

Examples of the polyfunctional (meth)acrylate having trifunctionality or higher functionality include aliphatic (meth)acrylates such as trimethylolpropane tri(meth)acrylate, ethoxylated trimethylolpropane tri(meth)acrylate, propoxylated trimethylolpropane tri(meth)acrylate, ethoxylated propoxylated trimethylolpropane tri(meth)acrylate, pentaerythritol tri(meth)acrylate, ethoxylated pentaerythritol tri(meth)acrylate, propoxylated pentaerythritol tri(meth)acrylate, ethoxylated propoxylated pentaerythritol tri(meth)acrylate, pentaerythritol tetra(meth)acrylate, ethoxylated pentaerythritol tetra(meth)acrylate, propoxylated pentaerythritol tetra(meth)acrylate, ethoxylated propoxylated pentaerythritol tetra(meth)acrylate, ditrimethylolpropane tetraacrylate, and dipentaerythritol hexa(meth)acrylate; and aromatic epoxy (meth)acrylates such as phenol novolac type epoxy (meth)acrylate and cresol novolac type epoxy (meth)acrylate.

These (meth)acrylates may be used singly or in combination of two or more kinds thereof. Furthermore, these (meth)acrylates may be used in combination with other polymerizable monomers.

When the curable resin component further contains a polymerizable monomer, the content of the polymerizable monomer may be 10 to 60 parts by mass with respect to 100 parts by mass of the total amount of the curable resin component.

The polymerization initiator is not particularly limited as long as it initiates polymerization by heating or irradiation with ultraviolet light. For example, in the case of using a compound having an ethylenically unsaturated group as the polymerizable monomer, the polymerizable initiator may be a thermoradical polymerization initiator or a photoradical polymerization initiator.

Examples of the thermoradical polymerization initiator include diacyl peroxides such as octanoyl peroxide, lauroyl peroxide, stearyl peroxide, and benzoyl peroxide; peroxy esters such as t-butyl peroxypivalate, t-hexyl peroxypivalate, 1,1,3,3-tetramethylbutyl peroxy-2-ethylhexanoate, 2,5-dimethyl-2,5-bis(2-ethylhexanoylperoxy)hexane, t-hexyl peroxy-2-ethylhexanoate, t-butyl peroxy-2-ethylhexanoate, t-butyl peroxyisobutyrate, t-hexyl peroxyisopropyl monocarbonate, t-butyl peroxy-3,5,5-trimethylhexanoate, t-butyl peroxylaurate, t-butyl peroxyisopropyl monocarbonate, t-butyl peroxy-2-ethylhexyl monocarbonate, t-butyl peroxybenzoate, t-hexyl peroxybenzoate, 2,5-dimethyl-2,5-bis(benzoylperoxy)hexane, and t-butyl peroxyacetate; and azo compounds such as 2,2'-azobisisobutyronitrile, 2,2'-azobis(2,4-dimethylvaleronitrile), and 2,2'-azobis(4-methoxy-2'-dimethylvaleronitrile).

Examples of the photoradical polymerization initiator include benzoin ketals such as 2,2-dimethoxy-1,2-diphenylethan-1-one; α-hydroxy ketones such as 1-hydroxycyclohexyl phenyl ketone, 2-hydroxy-2-methyl-1-phenylpropan-1-one, and 1-[4-(2-hydroxyethoxy)phenyl]-2-hydroxy-2-methyl-1-propan-1-one; and phosphine oxides such as bis(2,4,6-trimethylbenzoyl)phenyl phosphine oxide, bis(2,6-dimethoxybenzoyl)-2,4,4-trimethylpentyl phosphine oxide, and 2,4,6-trimethylbenzoyl diphenyl phosphine oxide.

These thermoradical and photoradical polymerization initiators may be used singly or in combination of two or more kinds thereof.

When the curable resin component further contains a polymerizable monomer and a polymerization initiator, the content of the polymerization initiator may be 0.01 to 5 parts by mass with respect to 100 parts by mass of the total amount of the polymerizable monomers.

The curable resin component may further contain an insulating filler, a sensitizer, an oxidation inhibitor, and the like as other components.

The insulating filler can be added for the purpose of imparting low thermal expansivity and low hygroscopicity to the resin layer. Examples of the insulating filler include non-metal inorganic fillers such as silica, alumina, boron nitride, titania, glass, and ceramics. These insulating fillers may be used singly or in combination of two or more kinds thereof. From the viewpoint of dispersibility in a solvent, the insulating filler may be particles having their surfaces treated with a surface treatment agent. The surface treatment agent may be, for example, a silane coupling agent.

When the curable resin component further contains an insulating filler, the content of the insulating filler may be 5 to 20 parts by mass with respect to 100 parts by mass of the total amount of the curable resin component. When the content of the insulating filler is within the above-described range, there is a tendency that heat resistance can be further enhanced without interrupting light transmission. Furthermore, when the content of the insulating filler is within the above-described range, there is a possibility of contributing to light peelability.

Examples of the sensitizer include anthracene, phenanthrene, chrysene, benzopyrene, fluoranthene, rubrene, pyrene, xanthone, indanthrene, thioxanthen-9-one, 2-isopropyl-9H-thioxanthen-9-one, 4-isopropyl-9H-thioxanthen-9-one, and 1-chloro-4-propoxythioxanthone.

When the curable resin component further contains a sensitizer, the content of the sensitizer may be 0.01 to 10 parts by mass with respect to 100 parts by mass of the total amount of the curable resin component. When the content of the sensitizer is within the above-described range, the influence on the characteristics and thin film-formability of the curable resin component tend to be small.

Examples of the oxidation inhibitor include quinone derivatives such as benzoquinone and hydroquinone; phenol derivatives (hindered phenol derivatives) such as 4-methoxyphenol and 4-t-butylcatechol; aminoxyl derivatives such as 2,2,6,6-tetramethylpiperidine-1-oxyl and 4-hydroxy-2,2,6,6-tetramethylpiperidine-1-oxyl; and hindered amine derivatives such as tetramethylpiperidyl methacrylate.

When the curable resin component further contains an oxidation inhibitor, the content of the oxidation inhibitor may be 0.1 to 10 parts by mass with respect to 100 parts by mass of the total amount of the curable resin component. When the content of the oxidation inhibitor is within the above-described range, there is a tendency that degradation of the curable resin component is suppressed, and contamination can be prevented.

The thickness of the first curable resin layer 14 may be, for example, 200 µm or less from the viewpoint of light transmissibility. The thickness of the first curable resin layer 14 may be 0.1 to 150 µm or 1 to 100 µm.

The thickness of the second curable resin layer 16 may be, for example, 200 µm or less from the viewpoint of stress relaxation. The thickness of the second curable resin layer 16 may be 1 to 150 µm or 10 to 100 µm.

The thickness of the first curable resin layer 14 and the thickness of the second curable resin layer 16 may be identical with each other or may be different from each other. The thickness of the first curable resin layer 14 may be, for example, smaller than the thickness of the second curable resin layer 16. From the viewpoint of the production of the laminated film for temporary fixing, it is preferable that the thickness of the first curable resin layer 14 and the thickness of the second curable resin layer 16 are identical with each other.

The thickness of the laminated film for temporary fixing 10 (sum of the first curable resin layer 14, the metal foil 12, and the second curable resin layer 16) may be 10 µm or more, 30 µm or more, or 50 µm or more from the viewpoint of handleability of the laminated film for temporary fixing, and may be 400 µm or less, 300 µm or less, or 200 µm or less from the viewpoint of easy peelability by light irradiation.

[Method for Producing Laminated Film for Temporary Fixing]

A method for producing the laminated film for temporary fixing 10 of an embodiment includes providing a first curable resin layer 14 on one surface of a metal foil 12 and providing a second curable resin layer 16 on the other surface of the metal foil 12 to obtain a laminated film for temporary fixing 10. In other words, the method for producing the laminated film for temporary fixing 10 includes providing the first curable resin layer 14 on the first surface 12a of the metal foil 12 and providing the second curable resin layer 16 on the second surface 12b of the metal foil 12, the second surface 12b being on the opposite side of the first surface 12a, to obtain the laminated film for temporary fixing 10.

The method for producing the laminated film for temporary fixing 10 may be a method including, for example, providing a first curable resin layer 14 on one surface (first surface 12a) of a metal foil 12 (first step); and providing a second curable resin layer 16 on the other surface (second surface 12b) of the metal foil 12 (second step). In the method for producing the laminated film for temporary fixing 10, the order of the first step and the second step is not particularly limited as long as curable resin layers (first curable resin layer 14 and second curable resin layer 16) can be provided on both surfaces of the metal foil 12.

In the first step, for example, first, the above-described curable resin component is subjected to stirring and mixing, kneading, and the like in a solvent to be dissolved or dispersed, and a varnish of the curable resin component is prepared. Subsequently, the varnish of the curable resin component is applied on a support film that has been subjected to a release treatment, by using a knife coater, a roll coater, an applicator, a comma coater, a die coater, or the like, and then the solvent is volatilized by heating to form a first curable resin film formed from the curable resin component on the support film. At this time, the thickness of the first curable resin film (in addition, the first curable resin layer 14) can be adjusted by adjusting the coating amount of the varnish of the curable resin component. Next, the first curable resin layer 14 can be provided by sticking the first curable resin film on one surface of the metal foil 12.

The solvent used for the preparation of the varnish of the curable resin component is not particularly limited as long as it has the characteristics capable of uniformly dissolving or dispersing each component. Examples of such a solvent include aromatic hydrocarbons such as toluene, xylene, mesitylene, cumene, and p-cymene; aliphatic hydrocarbons such as hexane and heptane; cyclic alkanes such as methylcyclohexane; cyclic ethers such as tetrahydrofuran and 1,4-dioxane; ketones such as acetone, methyl ethyl ketone, methyl isobutyl ketone, cyclohexane, and 4-hydroxy-4-methyl-2-pentanone; esters such as methyl acetate, ethyl acetate, butyl acetate, methyl lactate, ethyl lactate, and γ-butyrolactone; carbonic acid esters such as ethylene carbonate and propylene carbonate; and amides such as N,N-dimethylformamide, N,N-dimethylacetamide, and N-methyl-2-pyrrolidone. These solvents may be used singly or in combination of two or more kinds thereof. Among these, from the viewpoints of solubility and the boiling point, the solvent may be toluene, xylene, heptane, or cyclohexanone. The solid component concentration in the varnish may be 10% to 80% by mass based on the total mass of the varnish.

Stirring and mixing or kneading at the time of preparing the varnish of the curable resin component can be carried out by, for example, using a stirrer, a Raikai mixer, a three-roll, a ball mill, a bead mill, or a HomoDisper.

Examples of the support film include films of polyesters such as polyethylene terephthalate (PET), polybutylene terephthalate, and polyethylene naphthalate; polyolefins such as polyethylene and polypropylene; polycarbonate, polyamide, polyimide, polyamideimide, polyetherimide, polyether sulfide, polyether sulfone, polyether ketone, polyphenylene ether, polyphenylene sulfide, poly(meth)acrylate, polysulfone, and a liquid crystal polymer. The thickness of the support film may be, for example, 1 to 250 μm.

The heating conditions at the time of volatilizing the solvent from the varnish of the curable resin component applied on the support film can be appropriately set according to the solvent used and the like. The heating conditions may be, for example, 40° C. to 120° C. for 0.1 to 30 minutes.

Examples of the method of sticking the first curable resin film to one surface of the metal foil 12 include methods such as heat pressing, roll lamination, and vacuum lamination. Lamination can be carried out, for example, under the temperature conditions of 0° C. to 120° C.

The thickness of the first curable resin film may be, for example, 200 μm or less from the viewpoint of light transmissibility. The thickness of the first curable resin film may be 0.1 to 150 μm or 1 to 100 μm.

The first curable resin layer 14 can also be formed by directly applying the curable resin component on one surface of the metal foil 12. In the case of using a varnish of the curable resin component, the first curable resin layer 14 can also be formed by applying the varnish of the curable resin component on one surface of the metal foil 12 and volatilizing the solvent by heating.

In the second step, a second curable resin layer 16 can be provided by producing a second curable resin film in the same manner as in the first step and sticking the second curable resin film on the other surface of the metal foil 12. The second curable resin layer 16 can also be formed by directly applying the curable resin component on the other surface of the metal foil 12. In the case of using a varnish of the curable resin component, the second curable resin layer 16 can also be formed by applying the varnish of the curable resin component on the other surface of the metal foil 12 and volatilizing the solvent by heating. In this way, the laminated film for temporary fixing 10 can be obtained.

The thickness of the second curable resin film may be, for example, 200 μm or less from the viewpoint of stress relaxation. The thickness of the second curable resin film may be 1 to 150 μm or 10 to 100 μm.

The thickness of the first curable resin film and the thickness of the second curable resin film may be identical with each other or may be different from each other. The thickness of the first curable resin film may be, for example, smaller than the thickness of the second curable resin film. From the viewpoint of the production of the laminated film for temporary fixing, it is preferable that the thickness of the first curable resin film and the thickness of the second curable resin film may be identical with each other.

The method for producing the laminated film for temporary fixing 10 may be a method including, for example, preparing a laminated body in which a first curable resin film, a metal foil, and a second curable resin film are laminated in sequence; and sticking the first curable resin film and the second curable resin film in the laminated body to both surfaces of the metal foil. With such a method for producing, since the process of sticking the curable resin films occurs once, the laminated film for temporary fixing 10 can be produced more efficiently. The method of sticking the first curable resin film and the second curable resin film to both surfaces of the metal foil may be similar to that of the first step.

[Laminated Body for Temporary Fixing]

Figure 2:
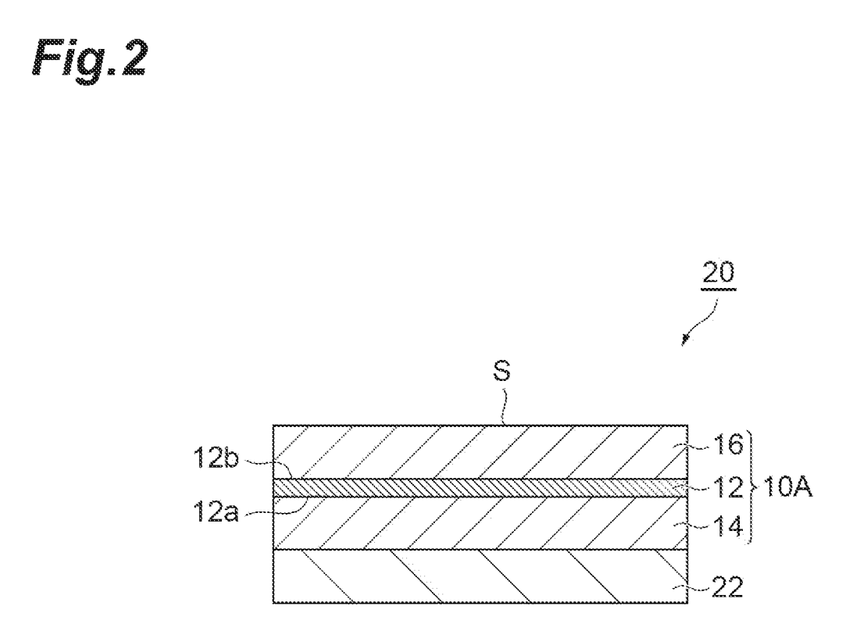
FIG. 2 is a schematic cross-sectional view illustrating an embodiment of a laminated body for temporary fixing.

FIG. 2 is a schematic cross-sectional view illustrating an embodiment of a laminated body for temporary fixing. The laminated body for temporary fixing 20 shown in FIG. 2 includes a support member 22 and a temporary fixing material layer 10A provided on the support member 22. The temporary fixing material layer 10A includes a first curable resin layer 14, a metal foil 12, and a second curable resin layer 16 laminated in sequence on the support member 22. That is, the temporary fixing material layer 10A includes a metal foil 12; a first curable resin layer 14 provided on a first surface 12a of the metal foil 12; and a second curable resin layer 16 provided on a second surface 12b of the metal foil 12, the second surface 12b being on the opposite side of the first surface 12a. The second curable resin layer 16 includes an outermost surface S of the temporary fixing material layer 10A, the outermost surface S being on the opposite side of the support member 22. According to such a laminated body for temporary fixing 20, since the laminated body includes the temporary fixing material layer 10A that includes the first curable resin layer 14, the metal foil 12, and the second curable resin layer 16 laminated in sequence, it is possible to separate a temporarily fixed semiconductor member from the support member with lower light irradiation energy.

The metal foil 12 may include, for example, a glossy surface that is glossy, and a non-glossy surface that is not glossy. At this time, the first surface 12a of the metal foil 12 may be a non-glossy surface from the viewpoint of being capable of suppressing reflection of light upon light irradiation.

The method for producing the laminated body for temporary fixing 20 is not particularly limited as long as a laminated body having a predetermined configuration can be obtained. The laminated body for temporary fixing 20 can also be obtained by, for example, a method including sticking the above-described laminated film for temporary fixing 10 onto a support member 22. In this case, the temporary fixing material layer 10A may be a layer formed of the above-described laminated film for temporary fixing 10. When the first curable resin layer 14 of the laminated film for temporary fixing 10 is stuck on the support member, the first surface 12a of the metal foil 12 in the laminated film for temporary fixing 10 may be a non-glossy surface.

The support member 22 is a plate-shaped body that has a high transmittance and can withstand a load received at the time of processing the semiconductor member. Examples of the support member 22 include an inorganic glass substrate and a transparent resin substrate.

The thickness of the support member 22 may be, for example, 0.1 to 2.0 mm. When the thickness of the support member 22 is 0.1 mm or more, handleability tends to be easier. When the thickness of the support member 22 is 2.0 mm or less, there is a tendency that the material cost can be suppressed.

Examples of the method of sticking the above-described laminated film for temporary fixing 10 onto the support member 22 include methods such as heat pressing, roll lamination, and vacuum lamination. Lamination can be carried out, for example, under the temperature conditions of 0° C. to 120° C.

The laminated body for temporary fixing 20 can also be obtained by a method other than the method including sticking the laminated film for temporary fixing 10 onto the support member 22. The laminated body for temporary fixing 20 can also be obtained by, for example, a method including preparing a support member 22, and laminating a first curable resin layer 14, a metal foil 12, and a second curable resin layer 16 on the support member 22 and bonding the layers together; and a method including preparing a first laminated body including a support member and a first curable resin layer provided on the support member, and a second laminated body including a metal foil and a second curable resin layer provided on the metal foil, and bonding the first curable resin layer 14 of the first laminated body and the metal foil 12 of the second laminated body together.

[Method for Producing Semiconductor Device]

A method for producing a semiconductor device of an embodiment includes preparing the above-described laminated body for temporary fixing (preparation step); temporarily fixing a semiconductor member to a support member with the temporary fixing material layer interposed therebetween (temporary fixing step); processing the semiconductor member temporarily fixed to the support member (processing step); and irradiating the laminated body for temporary fixing with light through the support member side and separating the semiconductor member from the support member (separation step). According to such a method for producing a semiconductor device, since the above-described laminated body for temporary fixing is used, it is possible to separate a temporarily fixed semiconductor member from a support member with lower light irradiation energy.

(Preparation Step)

In the preparation step, while a semiconductor member is processed in order to produce a semiconductor device, the above-described laminated body for temporary fixing 20 for temporarily fixing the semiconductor member to a support member is prepared.

(Temporary Fixing Step)

Figure 3A:
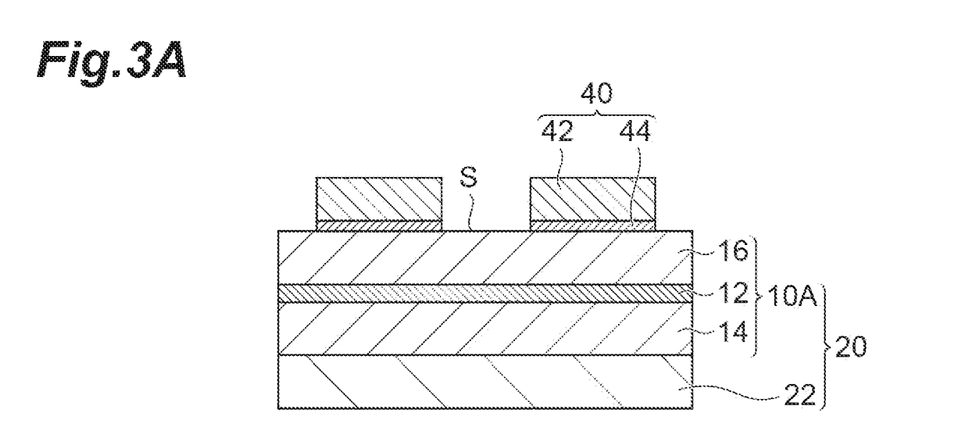
FIG. 3A and FIG. 3B are schematic cross-sectional views illustrating an embodiment of a method for producing a semiconductor device.
Figure 3B:
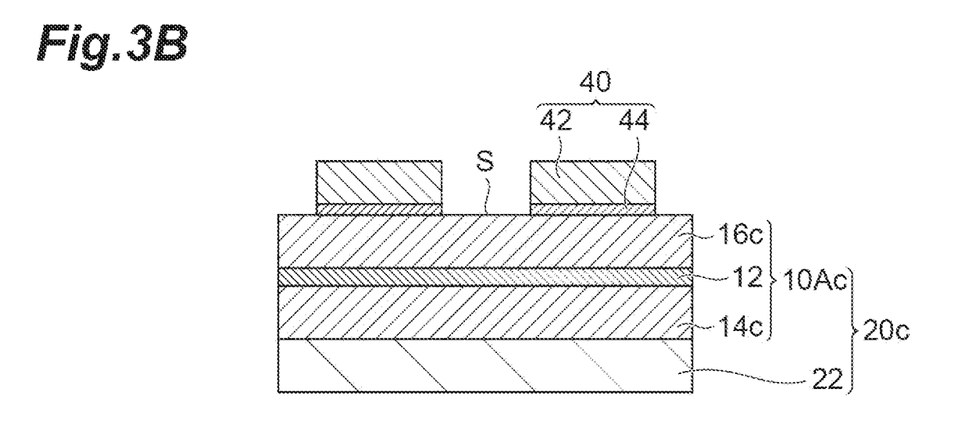

FIG. 3(a) and FIG. 3(b) are schematic cross-sectional views illustrating an embodiment of the method for producing a semiconductor device. In the temporary fixing step, a semiconductor member 40 is temporarily fixed to a support member 22, with the temporary fixing material layer 10A interposed therebetween. The outermost surface S on the side where the semiconductor member of the temporary fixing material layer 10A is temporarily fixed is a surface of the second curable resin layer 16. For example, the semiconductor member 40 can be temporarily fixed to the support member 22 (see FIG. 3(b)) by curing the second curable resin layer 16 (and the first curable resin layer 14) in a state in which the semiconductor member 40 is disposed on the second curable resin layer 16 (see FIG. 3(a)). In other words, the semiconductor member 40 may be temporarily adhered to the support member 22, with the temporary fixing material layer 10Ac having the cured second curable resin layer 16c (and the cured first curable resin layer 14c) interposed therebetween. In this way, a laminated body for temporary fixing 20c is formed.

The semiconductor member 40 may have a semiconductor substrate 42 and a rewiring layer 44. When the semiconductor member 40 has the semiconductor substrate 42 and the rewiring layer 44, the semiconductor member 40 is temporarily fixed to the support member 22, with the temporary fixing material layer 10A interposed therebetween, in the direction in which the rewiring layer is positioned on the second curable resin layer 16 side. The semiconductor member 40 may further have an external connection terminal. The semiconductor substrate 42 may be a semiconductor wafer or a semiconductor chip obtained by dividing a semiconductor wafer. In the example of FIG. 3(a), a plurality of semiconductor members 40 are disposed on the second curable resin layer 16; however, the number of the semiconductor member 40 may be one. The thickness of the semiconductor member 40 may be 1 to 1000 μm, 10 to 500 μm, or 20 to 200 μm, from the viewpoint of suppressing cracking during conveyance and at the time processing step or the like, in addition to miniaturization and thinning of semiconductor devices.

The semiconductor member 40 disposed on the second curable resin layer 16 is pressure-bonded to the second curable resin layer 16 by using, for example, a vacuum pressing machine or a vacuum laminator. In the case of using a vacuum pressing machine, the conditions for pressure-bonding may be an air pressure of 1 hPa or less, a pressure-bonding pressure of 1 MPa, a pressure-bonding temperature of 120° C. to 200° C., and a retention time of 100 to 300 seconds. In the case of using a vacuum laminator, the conditions for pressure-bonding may be, for example, an air pressure of 1 hPa or less, a pressure-bonding temperature of 60° C. to 180° C. or 80° C. to 150° C., a lamination pressure of 0.01 to 1.0 MPa or 0.1 to 0.7 MPa, and a retention time of 1 to 600 seconds or 30 to 300 seconds.

After the semiconductor member 40 is disposed on the second curable resin layer 16, by thermally curing or photocuring the second curable resin layer 16 (and the first curable resin layer 14), the semiconductor member 40 is temporarily fixed to the support member 22, with the temporary fixing material layer 10Ac having the cured second curable resin layer 16c (and the cured first curable resin layer 14c) interposed therebetween. The conditions for thermal curing may be, for example, 300° C. or lower or 100° C. to 250° C. for 1 to 180 minutes or 1 to 120 minutes.

(Processing Step)

Figure 4A:
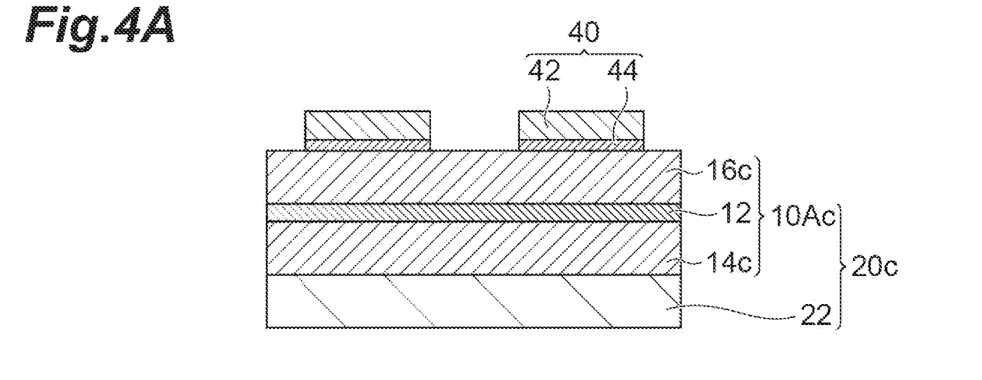
FIG. 4A, FIG. 4B, and FIG. 4C are schematic cross-sectional views illustrating an embodiment of the method for producing a semiconductor device.
Figure 4B:
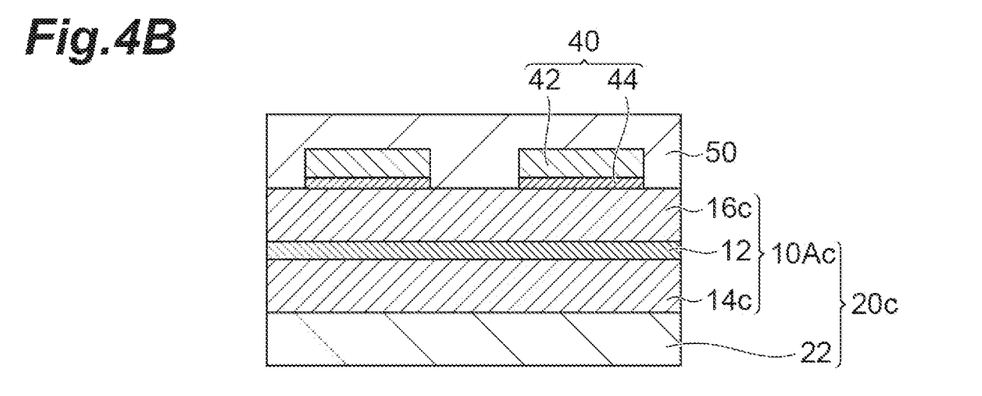
Figure 4C:
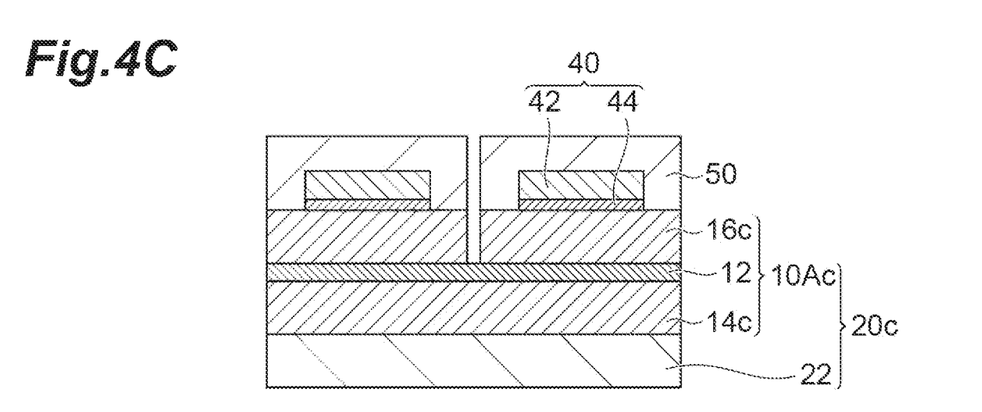

FIG. 4(a), FIG. 4(b), and FIG. 4(c) are schematic cross-sectional views illustrating an embodiment of the method for producing a semiconductor device. In the processing step, the semiconductor member 40 temporarily fixed to the support member 22 is processed. FIG. 4(a) shows an example of processing including thinning of the semiconductor substrate. Processing of the semiconductor member is not limited to this and can include, for example, thinning of the semiconductor substrate, division (dicing) of the semiconductor member, formation of a through electrode, an etching treatment, a plating reflow treatment, a sputtering treatment, or a combination of these.

After the processing of the semiconductor member 40, as shown in FIG. 4(b), an encapsulation layer 50 that encapsulates the processed semiconductor member 40 is formed. The encapsulation layer 50 can be formed by using an encapsulant that is conventionally used for the production of a semiconductor element. For example, the encapsulation layer 50 may be formed by means of a thermosetting resin composition. Examples of the thermosetting resin composition that is used for the encapsulation layer 50 contain epoxy resins such as a cresol novolac epoxy resin, a phenol novolac epoxy resin, a biphenyl diepoxy resin, and a naphthol novolac epoxy resin. The encapsulation layer 50 and the thermosetting resin composition for forming the encapsulation layer 50 may contain a filler and/or additives such as a flame retardant.

The encapsulation layer 50 is formed by using, for example, a solid material, a liquid material, a fine granular material, or an encapsulation film. In the case of using an encapsulation film, a compression encapsulation molding machine, a vacuum lamination apparatus, and the like are used. For example, the encapsulation layer 50 can be formed by coating the semiconductor member 40 with an encapsulation film that has been thermally melted using these apparatuses under the conditions of 40° C. to 180° C. (or 60° C. to 150° C.), 0.1 to 10 MPa (or 0.5 to 8 MPa), and 0.5 to 10 minutes. The thickness of the encapsulation film is adjusted such that the encapsulation layer 50 has a thickness equal to or greater than the thickness of the semiconductor member 40 after processing. The thickness of the encapsulation film may be 50 to 2000 μm, 70 to 1500 μm, or 100 to 1000 μm.

After the encapsulation layer 50 is formed, as shown in FIG. 4(c), the encapsulation layer 50 and the cured second curable resin layer 16c may be divided into a plurality of portions each including one semiconductor member 40.

(Separation Step)

Figure 5A:
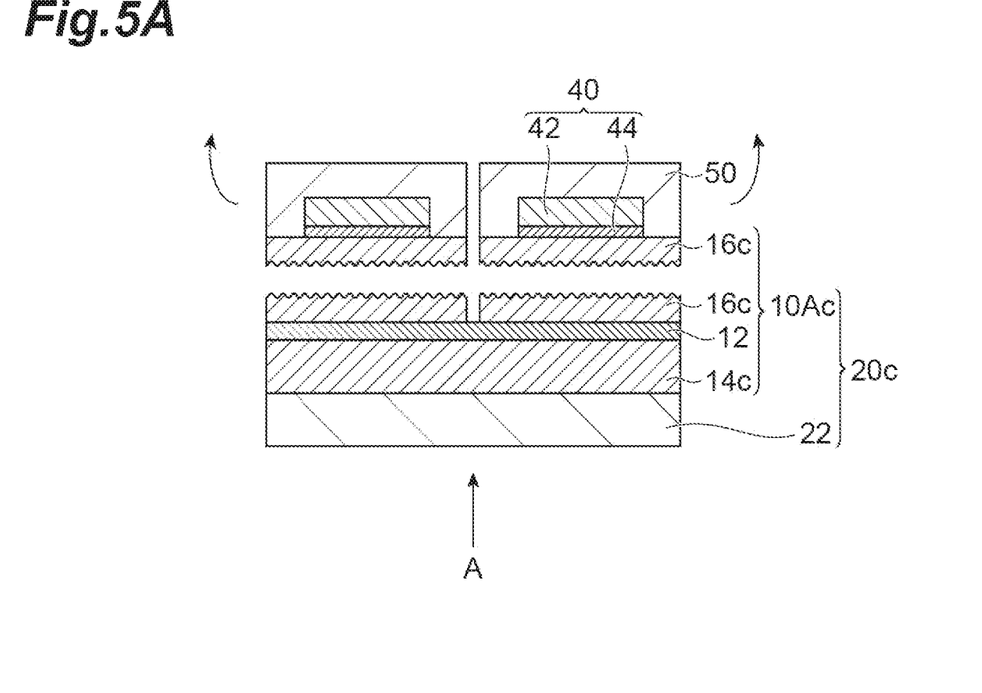
FIG. 5A and FIG. 5B are schematic cross-sectional views illustrating an embodiment of the method for producing a semiconductor device.
Figure 5B:
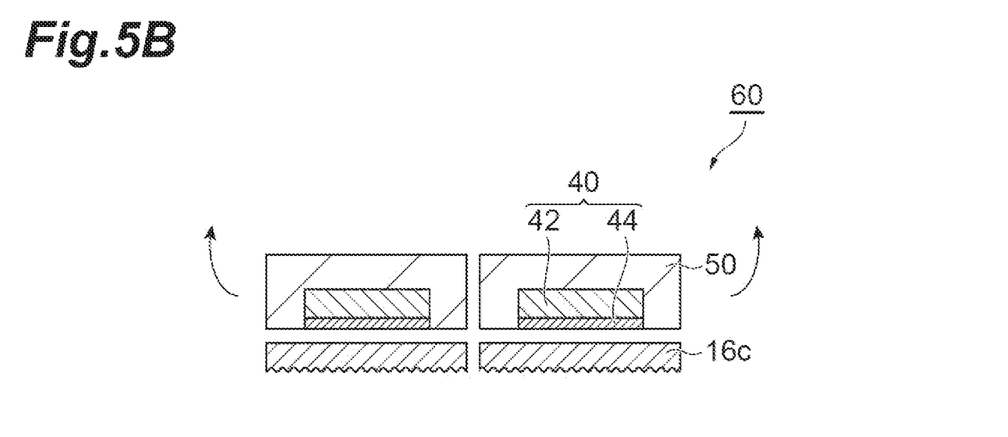

FIG. 5(a) and FIG. 5(b) are schematic cross-sectional views illustrating an embodiment of the method for producing a semiconductor device. In the separation step, the laminated body for temporary fixing is irradiated with light through the support member side, and the semiconductor member is separated from the support member.

As shown in FIG. 5(a), the laminated body for temporary fixing 20c is irradiated with light A through the support member 22 side to separate the semiconductor member 40 from the support member 22. As a result of irradiation with light A, the metal foil 12 absorbs light and instantaneously generates heat. Due to the generated heat, for example, melting of the cured first curable resin layer 14c and/or the cured second curable resin layer 16c, thermal stress generated between the support member 22 and the semiconductor member 40, and scattering of the metal foil 12 may occur. One or two or more of these phenomena are the main causes of the occurrence of cohesive peeling, interfacial peeling, and the like, and the semiconductor member 40 can be easily separated from the support member 22. In order to separate the semiconductor member 40 from the support member 22, stress may be slightly added to the semiconductor member 40 together with irradiation with light A.

The light A in the separation step may be coherent light. Coherent light is electromagnetic waves having properties such as high coherence, high directivity, and high monochromaticity. Coherent light tends to have high intensity because light beams having the same wavelength and the same phase are synthesized by intensifying each other. Laser light is generally coherent light. Examples of the laser light include a YAG laser, a fiber laser, a semiconductor laser, a helium-neon laser, an argon laser, and an excimer laser. The wavelength of the laser light may be 1300 nm or less. When the wavelength is 1300 nm or less, since light absorption of the support member 22 is suppressed while light absorption of the metal foil 12 is increased, peeling is enabled with lower light irradiation energy. The coherent light may be pulsed light.

The light A in the separation step may be incoherent light. Incoherent light is light that is not coherent, which is electromagnetic waves having properties such as no generation of interference fringes, low coherence, and low directivity. Incoherent light tends to be attenuated as the optical path length is longer. Light such as solar light and the light of a fluorescent lamp is incoherent light. The incoherent light can also be considered as light excluding laser light. Since the irradiation area of incoherent light is generally overwhelmingly larger than that of coherent light (that is, laser light), it is possible to decrease the number of times of irradiation. For example, separation of a plurality of semiconductor members 40 can be caused by a single irradiation. The incoherent light may contain infrared radiation. The incoherent light may be pulsed light.

The light source of the light is not particularly limited; however, the light source may be a xenon lamp. A xenon lamp is a lamp that utilizes light emission caused by application and discharge in an arc tube having xenon gas encapsulated therein. Since a xenon lamp is discharged while repeating ionization and excitation, it has a stable continuous wavelength from the ultraviolet light region to the infrared light region. Since the xenon lamp requires a shorter start time compared with lamps such as a metal halide lamp, the time related to the process can be shortened to a large extent. Furthermore, since it is necessary to apply a high voltage for light emission, high heat is generated instantaneously; however, the xenon lamp is advantageous even from the viewpoint that the cooling time is short, and continuous work is possible.

The irradiation conditions for the xenon lamp include applied voltage, pulse width, irradiation time, irradiation distance (distance between the light source and the temporary fixing material layer), irradiation energy, and the like, and these can be arbitrarily set according to the number of times of irradiation and the like. From the viewpoint of reducing damage to the semiconductor member 40, the irradiation conditions may be set such that the semiconductor member 40 can be separated by a single irradiation.

On the separated semiconductor member 40, a portion of the cured second curable resin layer 16c may adhere as a residue. The adhered residue is removed as shown in FIG. 5(b). The adhered residue may be removed by, for example, washing with a solvent, or may be detached by peeling. The solvent is not particularly limited; however, examples include ethanol, methanol, toluene, xylene, acetone, methyl ethyl ketone, methyl isobutyl ketone, and hexane. These may be used singly or in combination of two or more kinds thereof. In order to remove the adhered residue, the semiconductor member 40 may be immersed in a solvent, or ultrasonic cleaning may be performed. It is also acceptable to heat the semiconductor member 40 at a low temperature of about 100° C. or lower.

A semiconductor element 60 including a processed semiconductor member 40 can be obtained by the above-exemplified methods. A semiconductor device can be produced by connecting the obtained semiconductor element 60 to another semiconductor element or a substrate for mounting semiconductor elements.

EXAMPLES

Hereinafter, the present disclosure will be more specifically described by way of Examples. However, the present disclosure is not intended to be limited to these Examples.

Example 1

[Production of Laminated Body for Testing]
<Production of Curable Resin Film>
A maleic anhydride-modified styrene-ethylene-butylene-styrene block copolymer (trade name: FG1901GT, Kraton Polymers Japan, Ltd.) as a thermoplastic resin was dissolved in toluene solvent, and a thermoplastic resin solution at a concentration of 25% by mass was prepared. A dicyclopentadiene type epoxy resin (trade name: HP-7200H, DIC Corporation) as a thermosetting resin was dissolved in toluene solvent, and a thermosetting resin solution at a concentration of 25% by mass was prepared. An oxidation inhibitor (hindered phenol derivative, trade name: AO-60, ADEKA Corporation) was dissolved in toluene solvent, and an oxidation inhibitor solution at a concentration of 10% by mass was prepared. A curing accelerator (imidazole derivative, trade name: 2PZ-CN, SHIKOKU CHEMICALS CORPORATION) was dissolved in cyclohexanone solvent, and a curing accelerator solution at a concentration of 10% by mass was prepared. Subsequently, 70 parts by mass of the thermoplastic resin solution containing the above-described copolymer, 30 parts by mass of the thermosetting resin solution containing the above-described epoxy resin, 0.8 parts by mass of the oxidation inhibitor solution containing the above-described oxidation inhibitor, and 2 parts by mass of the curing accelerator solution containing the above-described curing accelerator were mixed to obtain a varnish of a curable resin component.

The obtained varnish of the curable resin component was applied on a release-treated surface of a polyethylene terephthalate (PET) film (PUREX A31, Teijin DuPont Films Japan Limited, thickness: 38 μm) by using a precision coating machine. The coating film was dried by heating at 100° C. for 10 minutes to produce a curable resin film having a thickness of about 80 μm. This curable resin film was used for the formation of curable resin layers (a first curable resin layer and a second curable resin layer).

<Production of Laminated Film for Temporary Fixing>
The curable resin film was disposed on both surfaces of an electrolytic copper foil (trade name: F3-WS-12, Furukawa Electric Co., Ltd.) having a thickness of 12 μm and having a roughened surface. At this time, the electrolytic copper foil and the curable resin film were disposed such that the opposite side surface of the PET film is in contact with the electrolytic copper foil. Next, the assembly was laminated using a vacuum pressurizing type laminator (V130, Nikko-Materials Co., Ltd.) under the conditions of a pressure of 0.5 MPa, a temperature of 100° C., and a pressurization time of 60 seconds, to obtain a laminated film for temporary fixing.

<Production of Laminated Body for Temporary Fixing>
A rectangular slide glass (thickness: 1.1 mm) having a size of 20 mm×20 mm was prepared as a support member. On the prepared slide glass, the laminated film for temporary fixing cut into a size of 20 mm×20 mm was disposed such that the copper foil roughened surface (non-glossy surface) came to the glass side. Subsequently, the assembly was laminated using a vacuum pressurizing type laminator (V130, Nikko-Materials Co., Ltd.) under the conditions of a pressure of 0.5 MPa, a temperature of 100° C., and a pressurization time of 60 seconds, to obtain a laminated body for temporary fixing having a configuration of support member/temporary fixing material layer (support member/first curable resin layer/metal foil/second curable resin layer).

<Production of Laminated Body for Testing>
On the second curable resin layer in the temporary fixing material layer of the laminated body for temporary fixing, a semiconductor chip (size: 20 mm×20 mm, thickness: 150 μm) was disposed as a semiconductor member. Subsequently, the assembly was laminated using a vacuum pressurizing type laminator (V130, Nikko-Materials Co., Ltd.) under the conditions of a pressure of 0.5 MPa, a temperature of 100° C., and a pressurization time of 60 seconds, and the first curable resin layer and the second curable resin layer in the temporary fixing material layer were cured by heating at 200° C. for 1 hour to obtain a laminated body for testing of Example 1 having a semiconductor member temporarily fixed to the support member.

Comparative Example 1

[Production of Laminated Body for Testing]
<Production of Support Member Including Metal Layer>
A rectangular slide glass (thickness: 1.1 mm) having a size of 20 mm×20 mm was prepared as a support member. On the prepared slide glass, a copper layer (thickness: 200 nm) was formed by sputtering. During sputtering, the copper layer was formed by RF sputtering after a pretreatment performed by reverse sputtering. The conditions for reverse sputtering (pretreatment) and RF sputtering are as follows.
(1) Reverse Sputtering (Pretreatment)
  Ar flow rate: $1.2 \times 10^{-2}$ Pam$^3$/s (70 sccm)
  RF power: 300 W
  Time: 300 seconds
(2) RF Sputtering
  Ar flow rate: $1.2 \times 10^{-2}$ Pam$^3$/s (70 sccm)
  RF power: 2000 W <Production of Laminated Body for Temporary Fixing and Production of Laminated Body for Testing>
The above-described curable resin film cut into a size of 20 mm×20 mm was disposed on the copper layer formed by sputtering on the slide glass. Subsequently, the assembly was laminated using a vacuum pressurizing type laminator (V130, Nikko-Materials Co., Ltd.) under the conditions of a pressure of 0.5 MPa, a temperature of 100° C., and a pressurization time of 60 seconds, to obtain a laminated body for temporary fixing having a configuration of support member/metal layer (copper layer)/curable resin layer. Next, a semiconductor chip (size: 20 mm×20 mm, thickness: 150 µm) was disposed on the curable resin layer, and the curable resin layers were cured under the same conditions as in Example 1, to obtain a laminated body for testing of Comparative Example 1 having a semiconductor member temporarily fixed to the support member.

<Peelability Test>

For the laminated body for testing of Example 1 and Comparative Example 1, each laminated body for testing was irradiated with a xenon lamp under two kinds of irradiation conditions, namely, weak irradiation conditions of applied voltage: 640 V, irradiation distance: 5 mm, number of times of irradiation: one time, and irradiation time: 1000 µs, and strong irradiation conditions of applied voltage: 670 V, irradiation distance: 5 mm, number of times of irradiation: one time, and irradiation time: 1000 µs, and the separability between the temporarily fixed semiconductor chip and the slide glass was evaluated. Regarding the xenon lamp, PulseForge (registered trademark) 1300 (wavelength range: 200 nm to 1500 nm, irradiation energy per unit area: 8.4 J/cm$^2$ (predicted value, weak irradiation conditions), 9.6 J/cm$^2$ (predicted value, strong irradiation conditions)) manufactured by NovaCentrix was used, and irradiation with the xenon lamp was performed through the support member (slide glass) side of the laminated body. The irradiation distance is the distance between the light source and the stage on which the slide glass was installed. Regarding the evaluation of the peelability test, a case in which the semiconductor chip naturally peeled off from the slide glass without applying an external force after irradiation with the xenon lamp, was rated as "A"; and a case in which the semiconductor chip did not peel off from the slide glass unless an external force was applied, was rated as "B". Note that since the laminated body for testing of Example 1 was rated as "A" under the weak irradiation conditions, the test was not performed under the strong irradiation conditions. The results are shown in Table 1.

TABLE 1

| | | Example 1 | Comparative Example 1 |
|---|---|---|---|
| Peelability test | Weak irradiation conditions | A | B |
| | Strong irradiation conditions | — | A |

As shown in Table 1, the laminated body for testing of Example 1 having a temporary fixing material layer of a specific configuration (first curable resin layer/metal oil/second curable resin layer) had excellent peelability (separability between the temporarily fixed semiconductor chip and the slide glass) even when the irradiation conditions were weak (even when the light irradiation energy was low), as compared with the laminated body for testing of Comparative Example 1 that did not have a temporary fixing material layer of a specific configuration. From these results, it was verified that the laminated film for temporary fixing of the present disclosure can form a temporary fixing material layer having excellent separability between the temporarily fixed semiconductor member and the support member (can be separated by lower light irradiation energy).

REFERENCE SIGNS LIST

10: laminated film for temporary fixing, 10A, 10Ac: temporary fixing material layer, 12: metal foil, 12a: first surface, 12b: second surface, 14: first curable resin layer, 14c: cured first curable resin layer, 16: second curable resin layer, 16c: cured second curable resin layer, 20, 20c: laminated body for temporary fixing, 22: support member, 40: semiconductor member, 42: semiconductor substrate, 44: rewiring layer, 50: encapsulation layer, 60: semiconductor element.

The invention claimed is:

1. A method for producing a laminated film for temporarily fixing a semiconductor member to a support member, the method comprising:
   providing a first curable resin layer on a first surface of a single-layered metal foil; and
   providing a second curable resin layer on a second surface of the single-layered metal foil to obtain the laminated film.

2. The method according to claim 1, wherein the single-layered metal foil comprises at least one metal selected from the group consisting of silver, gold, platinum, copper, titanium, nickel, molybdenum, chromium, and aluminum.

3. A laminated film for temporarily fixing a semiconductor member to a support member,
   the laminated film comprising a first curable resin layer, a single-layered metal foil, and a second curable resin layer laminated in sequence.

4. The laminated film according to claim 3, wherein the single-layered metal foil comprises at least one metal selected from the group consisting of silver, gold, platinum, copper, titanium, nickel, molybdenum, chromium, and aluminum.

5. A laminated body comprising the support member and the laminated film according to claim 3,
   wherein the laminated film is provided on the support member, and
   wherein the single-layered metal foil is laminated between the first curable resin layer and the second curable resin layer on the support member.

6. A method for producing a semiconductor device including a semiconductor member, the method comprising:
   temporarily fixing the semiconductor member to a support member, with a temporary fixing material layer interposed between the semiconductor member and the support member;
   processing the semiconductor member temporarily fixed to the support member; and
   separating the processed semiconductor member from the support member by irradiating the temporary fixing material layer with light from a side of the support member,
   wherein the temporary fixing material layer comprises a first curable resin layer, a second curable resin layer, and a single-layered metal foil laminated between the first curable resin layer and the second curable resin layer on the support member.

7. The method according to claim 6, wherein the light is incoherent light.

8. The method according to claim 7, wherein the incoherent light is light comprising at least infrared light.

9. The method according to claim 6, wherein a light source of the light is a xenon lamp.

10. The method according to claim 1, wherein the single-layered metal foil has a glossy surface and a non-glossy surface.

11. The method according to claim 10, wherein the first surface of the single-layered metal foil is the non-glossy surface.

12. The method according to claim 1, wherein the first curable resin layer is provided on the first surface of the single-layered metal foil and the second curable resin layer is provided on the second surface of the single-layered metal foil either simultaneously or in any sequence.

13. The method according to claim 1, wherein the first curable resin layer is provided on the first surface of the single-layered metal foil and the second curable resin layer is provided on the second surface of the single-layered metal foil simultaneously with each other.

14. The method according to claim 1, wherein the first curable resin layer is provided on the first surface of the single-layered metal foil after the second curable resin layer is provided on the second surface of the single-layered metal foil.

15. The method according to claim 1, wherein the second curable resin layer is provided on the second surface of the single-layered metal foil after the first curable resin layer is provided on the first surface of the single-layered metal foil.

* * * * *